United States Patent
Mende et al.

(10) Patent No.: US 9,476,960 B2
(45) Date of Patent: Oct. 25, 2016

(54) MEASUREMENT SYSTEM INCLUDING ACCESSORY WITH INTERNAL CALIBRATION SIGNAL

(71) Applicant: Tektronix, Inc., Beaverton, OR (US)

(72) Inventors: Michael J. Mende, Portland, OR (US); Richard A. Booman, Lake Oswego, OR (US)

(73) Assignee: Tektronix, Inc., Beaverton, OR (US)

( * ) Notice: Subject to any disclaimer, the term of this patent is extended or adjusted under 35 U.S.C. 154(b) by 19 days.

(21) Appl. No.: 14/133,379

(22) Filed: Dec. 18, 2013

(65) Prior Publication Data

US 2015/0168530 A1   Jun. 18, 2015

(51) Int. Cl.
*G01R 35/00* (2006.01)
*G01R 31/319* (2006.01)

(52) U.S. Cl.
CPC ......... *G01R 35/005* (2013.01); *G01R 31/3191* (2013.01)

(58) Field of Classification Search
USPC ............... 324/96, 601, 72.5, 750.02, 754.03, 324/754.01, 690, 715, 74, 754.06, 755.01, 324/149, 754.07, 756.01, 757.01, 76.11, 324/750.01, 537, 105, 750.16, 754.23, 7, 324/56.01, 115; 702/104, 85; 385/12
See application file for complete search history.

(56) References Cited

U.S. PATENT DOCUMENTS

| | | | |
|---|---|---|---|
| 4,928,278 A | 5/1990 | Otsuji et al. | |
| 6,057,678 A * | 5/2000 | Tagiri et al. | G01D 5/34 250/227.14 |
| 6,870,359 B1 * | 3/2005 | Sekel | 324/750.02 |
| 7,414,411 B2 * | 8/2008 | Tan et al. | 324/601 |
| 7,460,983 B2 * | 12/2008 | Pickerd et al. | 702/190 |
| 2001/0028251 A1 * | 10/2001 | Okayasu | 324/532 |
| 2005/0201658 A1 * | 9/2005 | Yakymyshyn et al. | G02F 1/035 385/12 |
| 2006/0269186 A1 | 11/2006 | Frame et al. | |
| 2007/0143638 A1 * | 6/2007 | Dobyns et al. | 713/300 |
| 2008/0048677 A1 | 2/2008 | Tan et al. | |

FOREIGN PATENT DOCUMENTS

| | | |
|---|---|---|
| EP | 0241142 A1 | 10/1987 |
| EP | 0242700 A2 | 10/1987 |

OTHER PUBLICATIONS

Extended European Search Report for European Patent Application No. 14198911.1, dated Apr. 24, 2015, 8 pages, Berlin.

* cited by examiner

*Primary Examiner* — Melissa Koval
*Assistant Examiner* — Nasima Monsur
(74) *Attorney, Agent, or Firm* — Marger Johnson

(57) ABSTRACT

An accessory for use with a test and measurement instrument. The accessory includes an input to receive a signal from a device under test, a calibration unit configured to apply a calibration or compensation signal internal to the accessory, and an output to output the signal from the device under test or the calibration or compensation signal to a test and measurement instrument.

8 Claims, 5 Drawing Sheets

MEASUREMENT SYSTEM INCLUDING ACCESSORY WITH INTERNAL CALIBRATION SIGNAL

TECHNICAL FIELD

This disclosure relates to the field of electronic test and measurement instruments and accessories therefor. The disclosed technology specifically addresses the problem of calibrating the accessories for the electronic instruments.

BACKGROUND

Traditionally, calibrating or compensating an accessory, such as a probe, in a test and measurement system involves removing the accessory from a device under test (DUT) and connecting the accessory to a calibrating or compensation stimulus. Conventionally, the test and measurement system includes a host, a controller, and a device under test. An accessory is attached to the device under test and measures a signal from the device under test and send it back to the host. However, to calibrate the accessory, the accessory has to be removed from the device under test and attached to a calibration/compensation stimulus, typically from the host. That is, the calibrating or compensation stimulus is located on a host, such as a test and measurement instrument. Connecting the probe/accessory to the calibration or compensation stimulus may involve the use of special adapters and fixtures to interface between probe/accessory and the stimulus signal.

Further, the ability to accurately and reliably calibrate or compensate an accessory for a measurement system is limited by the specification and capabilities of the calibration or compensation output signal. What is needed is the ability to inject a calibration or compensation signal into an accessory to eliminate the need to manually connect the accessory to a calibration or compensation signal and also the need to remove the accessory from a DUT to calibrate or compensate the probe.

SUMMARY

Certain embodiments of the disclosed technology include an accessory for use with a test and measurement instrument. The accessory includes an input to receive a signal from a device under test, a calibration unit configured to apply a calibration or compensation signal internal to the accessory, and an output circuit to output the signal from the device under test or the calibration or compensation signal to a test and measurement instrument, and.

Other embodiments include a system for calibrating an accessory. The system includes a host, a controller connected to the host, and an accessory connected to the controller. The accessory includes an input to receive a signal from a device under test, a calibration unit configured to apply a calibration or compensation signal internal to the accessory, and an output circuit configured to output the signal from the device under test or the calibration or compensation signal to the host.

Other embodiments include a system for calibrating an accessory. The system includes a host and an accessory. The accessory includes an input to receive a signal from a device under test, a calibration unit configured to apply a calibration or compensation signal internal to the accessory, and an output circuit configured to output the signal from the device under test or the calibration or compensation signal to the host.

DETAILED DESCRIPTION

Figure 1:
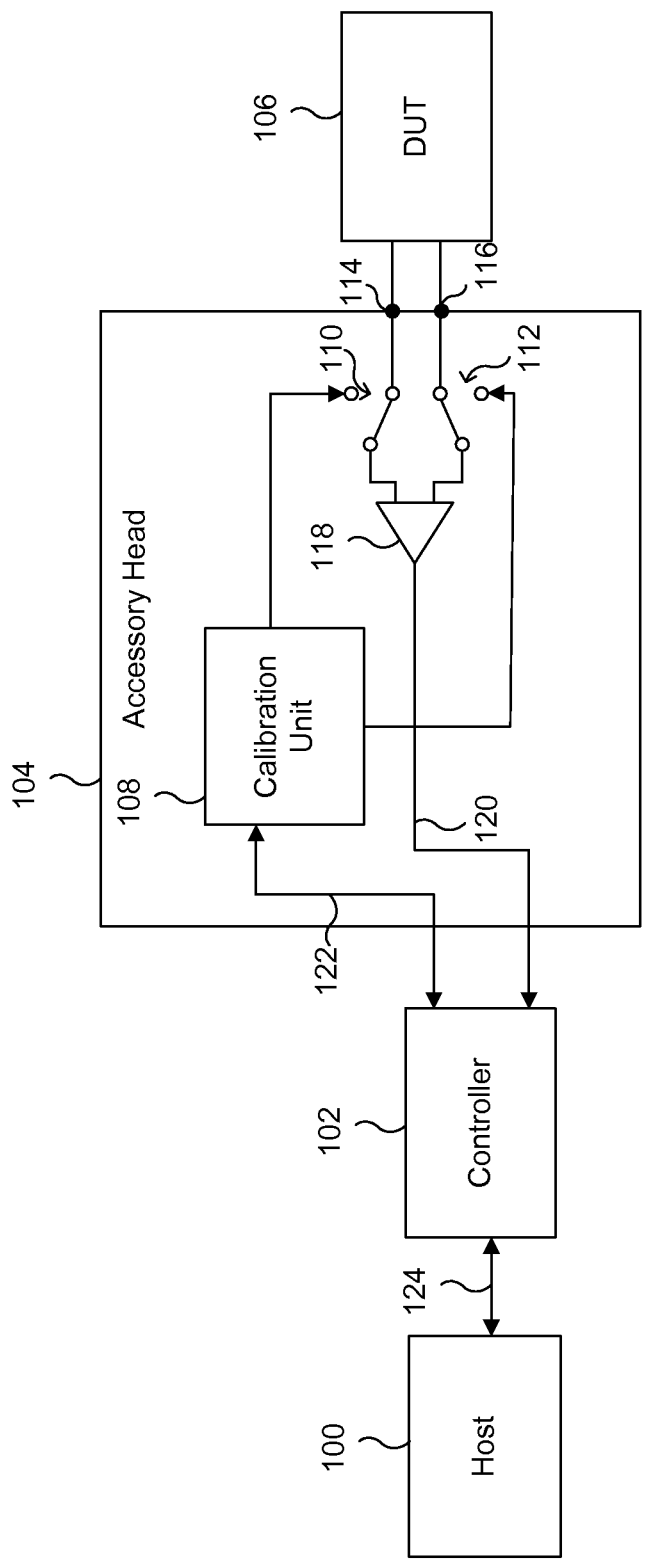
FIGS. 1-3 illustrate a measurement system with an accessory head that contains a calibration unit.

In the drawings, which are not necessarily to scale, like or corresponding elements of the disclosed systems and methods are denoted by the same reference numerals.

There are times when an accessory attached to a DUT cannot be easily removed in order to calibrate or compensate the accessory. For example, the accessory could be permanently installed in a test fixture, soldered to a DUT, installed at a hard-to-access or remote location, in an environmental chamber, or in a hazardous location, such as a location with high voltage. Accordingly, in situations such as these, it is important to be able to calibrate or compensate the accessory without removing the accessory from the DUT.

Embodiments of the disclosed technology includes a test and measurement system that includes a host 100, such as a test and measurement instrument, a controller 102, an accessory head 104, and a DUT 106. One example of such a system is shown in FIG. 1. The accessory head 104 includes a calibration/compensation unit 108, which is described in more detail below.

Rather than the calibration/compensation stimulus supplied from an external source or the host 100, the accessory head 104 is capable of supplying the calibration/compensation signal via the calibration/compensation unit 108. In some embodiments, the accessory head 104 also includes switches 110 and 112.

During a measurement operation mode, a signal from the DUT 106 is received at inputs 114 and 116 of the accessory head 104. Switches 110 and 112 are engaged to read the inputs from the DUT 106 and send the signals through an amplifier 118. The measured signal is then sent to the host 100 through the main signal path 120 and path 124.

Figure 2:
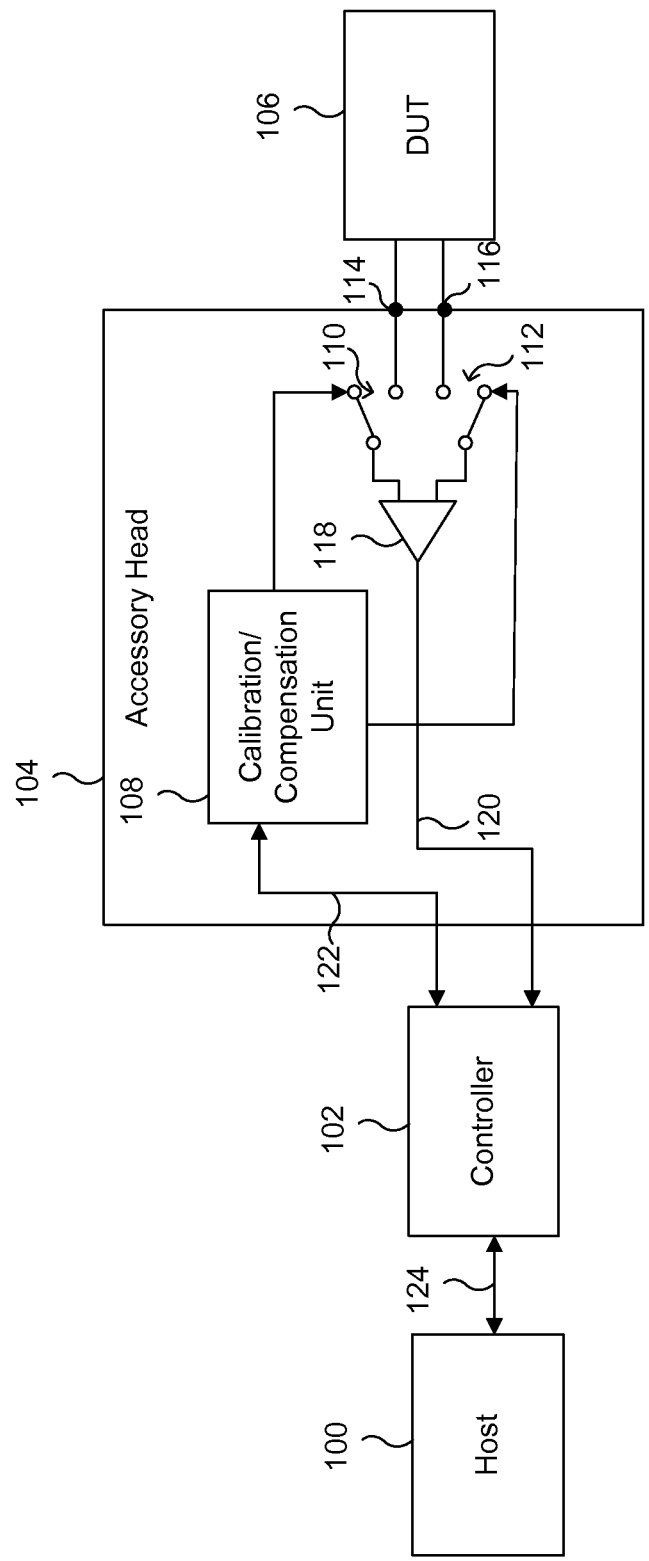

During a calibration or compensation mode, switches 110 and 112 are toggled as shown in FIG. 2 to the calibration/compensation unit 108. A user can indicate at the host 100 that a calibration or compensation is desired for the accessory head. Or the host 100 may have an algorithm for deciding when a calibration or compensation needs to occur. The instruction is then sent to the controller 102 or directly to the accessory head 104, as discussed in more detail below, through path 124 calibration/compensation unit 108. Switches 110 and 112 are then toggled as shown in FIG. 2. A calibration or compensation signal is then sent to amplifier 118 and output to the controller 102 through the main signal path 120. The calibration or compensation signal sent from the calibration/compensation unit 108 is known. Therefore, when the signal is read at the host 100 or controller 102, any calibration or compensation that is needed can be applied to the signal.

In the embodiments shown in FIGS. 1 and 2, the user may or may not need to de-energize the DUT 106 before performing the calibration. The accessory head 104 may stay connected to the DUT 106 and need not be removed.

Figure 3:
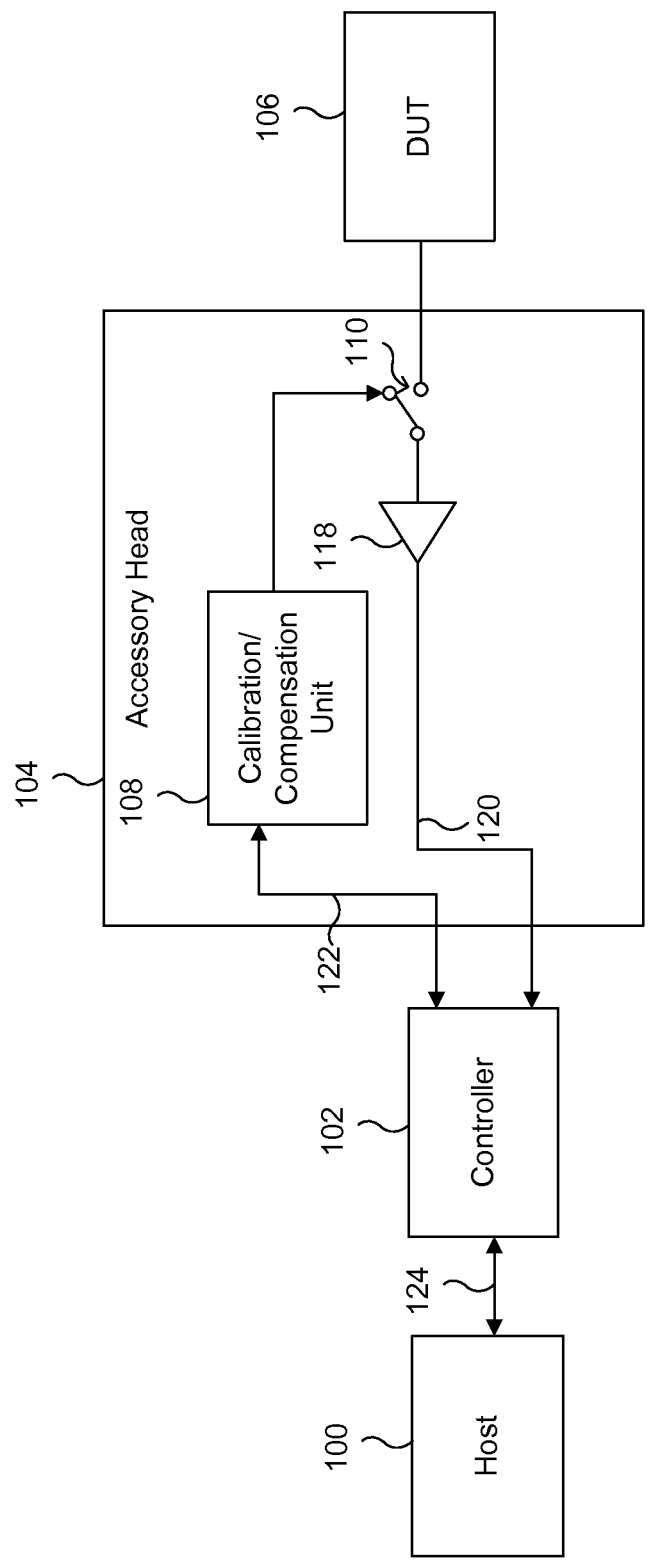

FIGS. 1 and 2 show a differential accessory head to receive two inputs from the DUT 106. However, the calibration/compensation unit 108 may also be used in an accessory head 104 with a single-ended input, as shown in FIG. 3. The system of FIG. 3 would work identical to that shown in FIGS. 1 and 2, except only a single switch 110 would be needed.

Figure 4:
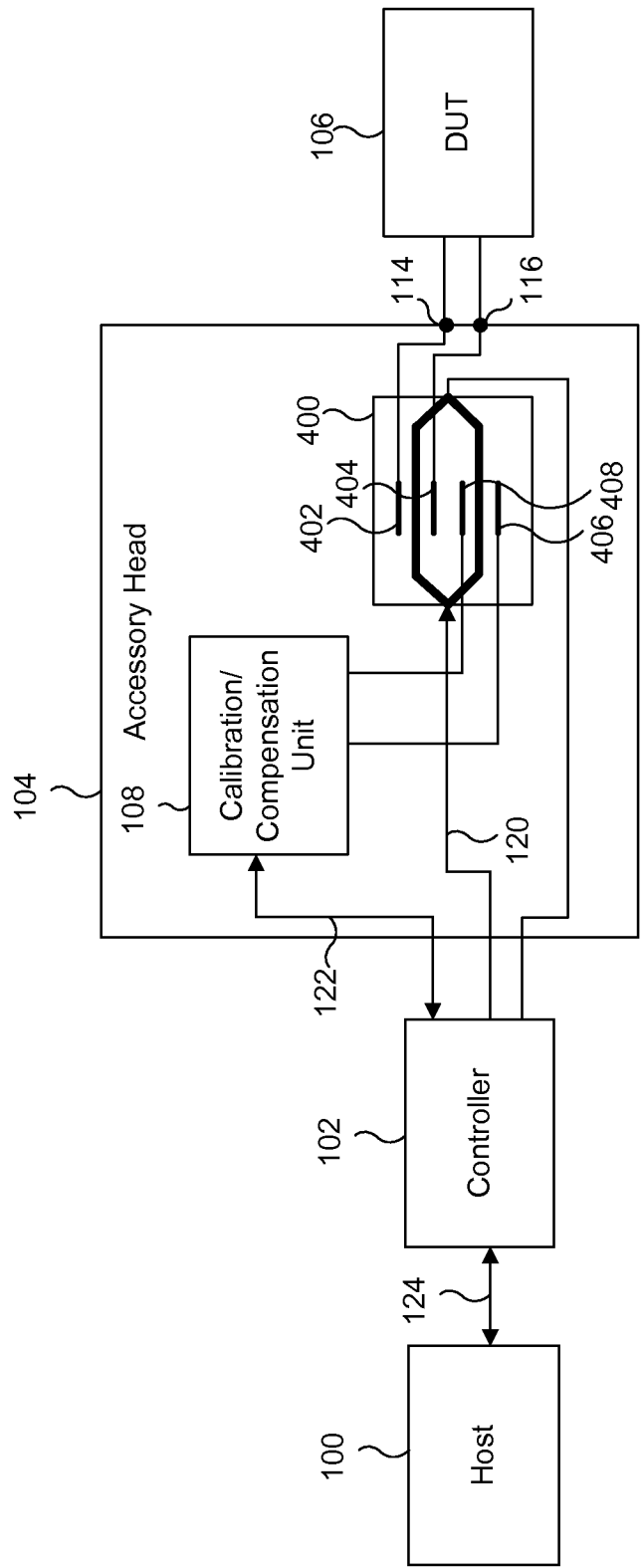
FIG. 4 illustrates a measurement system with an accessory head that includes an optical sensor and a calibration unit.

As shown in FIG. 4, the accessory head 104 may include an optical sensor if the accessory head 104 is an optical accessory head. If such is the case, the measurement system shown in FIG. 4 would still include a host 100, a controller 102, a calibration/compensation unit 108 and a DUT 106, as discussed above with respect to FIGS. 1 and 2. Rather than the use of switches 110 and 112, and amplifier 118, the measurement system of FIG. 4 includes an optical sensor 400. The optical sensor 400 may be, for example, a Mach-Zehnder optical sensor. However, other optical sensors may be used as well.

Inputs 114 and 116 of the accessory head 104 are connected to signal input electrodes 402 and 404. The output from the signal input electrodes 402 and 404 are sent from the optical sensor 400 to the controller 102 through the main signal path 120. Calibration/compensation unit 108, on the other hand, is connected to the another set of control electrodes 406 and 408 of the optical sensor 400 which are separated and electrically isolated from the signal input electrodes 402 and 404.

As discussed above, when a calibration or compensation is desired, an instruction can be sent from the host 100 to controller 102. Controller 102 then sends the instruction to calibration/compensation unit 108 through the communication link 122. The calibration or compensation signal from the calibration/compensation unit 108 is sent to the control electrodes 406 and 408 in optical sensor 400. The output of the optical sensor is then sent to the controller through the main signal path 120. As also discussed above, the output can then be calibrated or compensated as needed in the controller 102 or the host 100.

During a measurement operation, the signal from the DUT 106 is read though the optical sensor 400 from the signal input electrodes 402 and 404.

If an optical sensor 400 is used in the accessory head 104, then there is a known relationship between the signal input electrodes 402 and 404 and the control electrodes 406 and 408. Further, the signal input electrodes 402 and 404 and the control electrodes 406 and 408 are physically and electrically isolated from each other. Due to this feature, a calibration or compensation can be performed even when the DUT 106 is energized. The user may or may not need to de-energize the DUT 106 depending on the calibration/compensation algorithm. Since there is a known relationship between the signal input electrodes 402 and 404 and the control electrodes 406 and 408, a scaling constant can be determined. This scaling allows the input at the control electrodes 406 and 408 to be scaled to the input signal path electrodes 402 and 404.

The disclosed technology is capable of not only calibrating, for example, direct current voltage, but can also be used to compensate the gain or frequency of an alternating current voltage.

The disclosed technology is also not limited to use on a voltage probe. The accessory device may be any type of transducer device or general accessory device requiring voltage, current, power, etc., for operation, such as a measurement probe, measurement probe adapter, active filter devices, probe calibration fixture, probe isolation accessory, or the like.

The host 100 may be a test and measurement instrument, such as an oscilloscope, logic analyzer, spectrum analyzer or similar such devices having an accessory device interface for accepting an accessory device.

The connection to the controller 102 of the accessory head 104 may be a wired, optical fiber or a wireless connection as known to one of ordinary skill in the art. If the DUT 106 and accessory head 104 are located at a remote location, it may be necessary to have a wireless connection. Any of the signal paths 120, 122 and 124 may be a wired or wireless connection as known to one of ordinary skill in the art.

Figure 5:
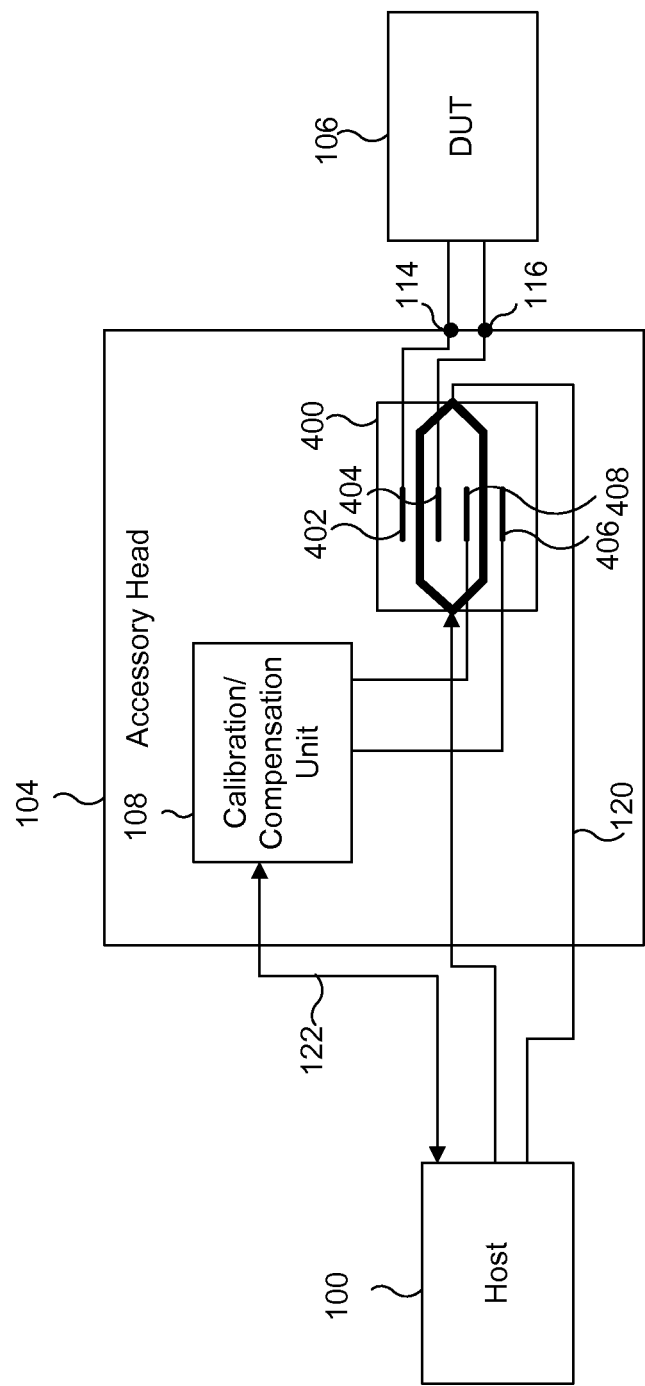
FIG. 5 illustrates a measurement system according to other embodiments of the disclosed technology.

In some embodiments, as shown in FIG. 5, a controller is not required. That is, the host 100 is connected directly to the accessory head 104. In this embodiment, the main signal path 122 is connected directly to the host 100. Further, the output from the accessory head is sent directly to the host 100, rather than through a controller. Although FIG. 5 is shown with an optical sensor 400, a controller may also be removed in the embodiments shown in FIGS. 1 and 2 and the calibration/compensation unit 108 and the output from the accessory head 104 can be sent directly to the host 100.

The term "controller" and "processor" as used herein is intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

What is claimed is:

1. A voltage probe for use with a test and measurement instrument, comprising:
    an input configured to receive a signal from a device under test;
    a calibration unit, internal to the probe, configured to apply a calibration or compensation signal internal to the voltage probe;
    an output configured to output the signal from the device under test to a test and measurement instrument or output the calibration or compensation signal to the test and measurement instrument; and
    an optical voltage sensor, wherein the input configured to receive the signal from the device under test is connected to signal input electrodes of the optical voltage sensor and the calibration unit is connected to control electrodes of the optical voltage sensor.

2. The voltage probe of claim 1, wherein the calibration unit is further configured to apply the calibration or compensation signal when the voltage probe is attached to a device under test.

3. The voltage probe of claim 1, wherein the signal from the device under test is output from the voltage probe during a measurement operation and the calibration or compensation signal from the calibration unit is output from the voltage probe during a calibration operation.

4. A system for calibrating a voltage probe according to claim 1, the system comprising the test and measurement instrument.

5. The system of claim 4, further comprising a controller.

6. A method of internally calibrating a voltage probe in a measurement system including a host, a controller and a device under test, the method comprising:
    measuring a signal through an optical voltage sensor from a device under test via the voltage probe during a measurement operation;
    outputting the measured signal from the device under test to the host;
    sending a calibration or compensation signal from a calibration unit internal to the voltage probe during a calibration operation to the host through the controller and the optical voltage sensor; and
    calibrating or compensating the signal from the device under test at the host based on the calibration or compensation signal received at the host;
    wherein an input configured to receive the signal from the device under test is connected to signal input electrodes of the optical voltage sensor and the calibration unit is connected to control electrodes of the optical voltage sensor.

7. The method of claim 6 further comprising switching between the device under test during a measurement operation and the calibration under during a calibration operation via a switch.

8. The method of claim 6, wherein the calibration or compensation signal is sent when the voltage probe is attached to a device under test.

* * * * *